United States Patent [19]

Hays et al.

[11] 3,887,373

[45] June 3, 1975

[54] NON-POLLUTING PHOTORESIST DEVELOPING PROCESS

[75] Inventors: Robert G. Hays, Scottsdale; Henry G. Hughes, Phoenix; William L. Hunter, Scottsdale, all of Ariz.

[73] Assignee: Motorola, Inc., Chicago, Ill.

[22] Filed: Dec. 12, 1973

[21] Appl. No.: 424,138

Related U.S. Application Data

[62] Division of Ser. No. 350,246, April 11, 1973.

[52] U.S. Cl. .......................... 96/36; 96/36; 96/36.2; 96/49; 96/91 N; 96/115 R

[51] Int. Cl. .............................................. G03f 7/08

[58] Field of Search ............ 96/91 N, 115 R, 49, 48, 96/33, 35, 36.3, 36, 36.2

[56] References Cited

UNITED STATES PATENTS

| | | | |
|---|---|---|---|
| 3,622,368 | 11/1971 | Okuna et al. | 96/49 |
| 3,624,227 | 11/1971 | Hwang | 96/33 |
| 3,634,086 | 1/1972 | Lawson et al. | 96/49 |
| 3,634,087 | 1/1972 | Houle et al. | 96/49 |
| 3,669,662 | 6/1972 | Aghihotri | 96/91 N |
| 3,759,850 | 9/1973 | Lehman | 96/33 |
| 3,779,758 | 12/1973 | Polichette | 96/36 |

*Primary Examiner*—Charles L. Bowers, Jr.
*Attorney, Agent, or Firm*—Vincent J. Rauner; Willis E. Higgins; Charles R. Hoffman

[57] ABSTRACT

Photoresist compositions including 2,6-bis(p-azidobenzylidene)-4-methylcyclohexanone and cyclized polyisoprene rubber dissolved in saturated aliphatic or cyclo-aliphatic hydrocarbons or other non-aromatic, saturated solvents having solubility parameter values close to that of polyisoprene.

3 Claims, No Drawings

NON-POLLUTING PHOTORESIST DEVELOPING PROCESS

This is a division of application Ser. No. 350,246, filed Apr. 11, 1973.

BACKGROUND OF THE INVENTION

This invention relates to photoresist compositions utilizing non-aromatic saturated solvents.

It is known to use unsaturated polymers with light-sensitive additives, which upon exposure to light cause the polymer to cross-link, to form a thin layer on a suitable support. By subsequent development with a solvent or solvent system appropriate for the particular polymer, the non-cross-linked parts of the layer can be dissolved out; the cross-linked parts of the layer are insoluble and remain on the support as a relief. A well-known photoresist composition for this purpose is cyclized polyisoprene containing double bonds with a sensitizer of 2,6-bis(p-azidobenzylidene)-4-methylcyclohexanone in a solvent containing a high concentration of xylene. The structure of the sensitizer is as follows:

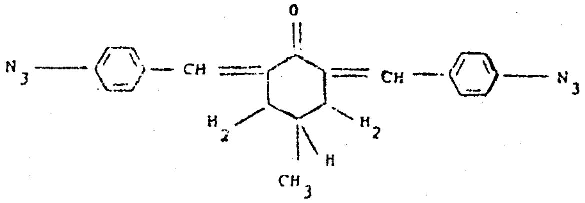

The structure of the resin, which is primarily cyclized polyisoprene, is as follows:

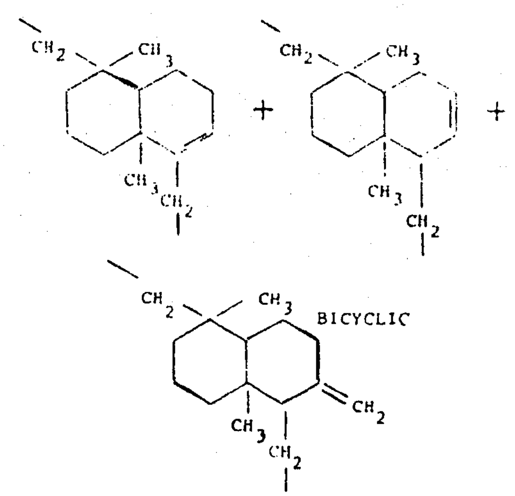

The resin may further include some monocyclic and even some uncyclized polyisoprene. When the above-described photoresist composition is exposed to actinic radiation, particularly ultraviolet light in the 355–365 m$\mu$ range, the sensitizer initiates a reaction causing cross-linking throughout the polymer. This photoresist composition is widely used in the semiconductor industry because of its good adhesion characteristic on silicon, silicon dioxide and metal substrate wafers such as aluminum, nichrom, or gold.

The main problem with the above-described photoresist compositions is that the xylene solvent does not meet the requirements of recent air pollution control regulations. The general effect of the air pollution control regulations is to limit the amount of organic material discharged into the atmosphere each day from equipment which processes material having organic solvents therein. In particular, the regulations limit the amount of discharge into the atmosphere from equipment used for processing material having photochemically reactive solvents therein. Any solvent composed of more than 5% xylene is classified as a photochemically reactive solvent, and therefore the above-described photoresist compositions may not be used where such regulations are enforced. Further, any solvent including a combination of hydrocarbons, alcohols, aldehydes, esters, ethers or ketones having an olefinic or cyclo-olefinic type of unsaturation falls under the above regulations. A photochemically reactive solvent is one that reacts in the presence of ultraviolet light to produce other constituents, such as methane, ethane, carbon, carbon monoxide, etc.

The present invention solves the above-described shortcomings of prior art photoresist compositions by providing a non-aromatic saturated solvent base for the photoresist compositions.

SUMMARY OF THE INVENTION

It is an object of this invention to provide low cost photoresist compositions which do not utilize solvents ruled out by certain air pollution control regulations.

It is another object of the invention to provide an environmentally acceptable photoresist composition and developer therefor having a non-aromatic, non-olefinic solvent having suitable solubility parameters for resin systems and sensitizer systems which are commercially available.

It is another object of the invention to provide a photoresist composition which does not use xylene as a solvent.

It is another object of this invention to provide a developer for photoresist compositions of the type described.

Briefly described, the invention provides photoresist compositions including commercially available sensitizers, and cyclized isoprene and polyisoprene polymers dissolved in non-aromatic, non-olefinic hydrocarbon solvents having suitable solubility parameters.

The foregoing and other objects and advantages of the invention will be apparent from the following more particular description of preferred embodiments of the invention.

DESCRIPTION OF THE INVENTION

A commonly used photoresist composition in the semiconductor industry is composed of 2,6-bis(p-azidobenzylidene)-4-methylcyclohexanone as a sensitizer and cyclized polyisoprene polymers as a resin system, and a high concentration of xylene in the solvent system. While this composition has many advantages, the xylene solvent used does not meet the requirements set by recent air pollution regulations, since the regulations limit the amount of photochemically reactive organic materials and the amounts of aromatic, olefinic, or unsaturated materials which may be discharged into the atmosphere. The photoresist pollutants are discharged into the atmosphere from exhaust hoods, which are always provided over each work station at which photoresist is utilized. Containers of photoresist are kept under such hoods, and evaporation of the solvent from them is discharged into the atmosphere from the exhaust hoods. Also, at various stages in the photoresist processing steps, the wafers are baked to harden the photoresist, and more evaporation of solvent occurs, which is exhausted through the exhaust hoods.

These limitations clearly preclude the use of a solvent composed of more than 5% xylene. Therefore, to derive an environmentally acceptable photoresist composition, an investigation of other solvents for the above-mentioned sensitizer and resin systems was undertaken in the course of the present invention.

In the course of the investigation, attempts were initially made to utilize various non-aromatic solvents as photoresist developers. It was initially discovered that certain non-aromatic saturated hydrocarbon solvents, including certain naptha-type solvents and cyclohexane, worked fairly well as developers for photoresist. This was an unexpected result, because the polyisoprene resin and the normally used azide sensitizers are relatively insoluble in the naptha class of solvents, as explained hereinafter. It should be recognized that the term naptha is a term which includes a large number of solvents obtained from distillation of fractions from crude petroleum. Naptha includes primarily carbon chains in the range of $C_5$–$C_{10}$. As the percentage of the solvent consisting of the longer carbon chains increases, the distillation range increases. Commercially available naptha solvents include Shell Super VM & P-66, Shell Super VM & P Naptha, Shell 360–66, Shell Sol 360, and many others. The main differences between these many solvents are the different distillation ranges. The most reasonable explanation for these results was that the solvents had enough hydrocarbons in the required solubility parameter range to act as a solvent. Next, an investigation of the solubility parameter ranges was undertaken for napthatype solvents and others having acceptably low aromatic contents. Those having a value of the solubility parameter δ reasonably close to that of polyisoprene were tested as photoresist solvents and developers. For a definition of the solubility parameter δ and for a comprehensive discussion of dissolving polymers in solvents, see H. Burrell, *Polymer Handbook*, J. Brandrup and E. H. Immergut, Editors, Interscience Publishers, N.Y. 1966, p. IV–341 to IV–346. The values of δ for various solvents and for polyisoprene obtained from the above-cited *Polymer Handbook* are included in TABLE I.

TABLE I

SOLUBILITY PARAMETERS

| Substance | δ (cal/cc) ½ |
|---|---|
| Polyisoprene | 7.4 – 8.4 |
| Xylene | 8.8 |
| Cyclohexane | 8.2 |
| VM & P Naptha | 7.6 |
| Hexane | 7.3 |
| Heptane | 7.4 |
| Pentane | 7.0 |
| Cyclopentane | 8.7 |

It is known that xylene is a very strong solvent for cyclized polyisoprene, and that naptha-type solvents are weak solvents for cyclized polyisoprene. It is estimated that the δ values for other naptha-type solvents not listed in the *Polymer Handbook* should be very close to that for VM & P Naptha, since they differ mainly in saturated hydrocarbon chain length.

The composition of the Shell solvents tested as photoresist solvents are listed in TABLE II; the distillation ranges are also included. The numbers in TABLE II are obtained from the *Shell Chemical Solvents Bulletin*, February 1970. For comparison, data for Shell Xylene is also given.

TABLE II

PERCENT VOLUME COMPOSITION OF SOLVENTS

| | Shell Sol 360 | Shell Sol 360–66 | Shell Super VM & P–66 (LA) | Shell Super VM & P (SF) | Shell Super VM & P Naptha | Shell Xylene |
|---|---|---|---|---|---|---|
| Saturates | 97.5 | 91.7 | 89.9 | 91.4 | 89.2 | 0.1 |
| Olefinics | 0.5 | 0.4 | 0.0 | 0.5 | 0.7 | 0.0 |
| Aromatics (Total) | 2.0 | 7.9 | 10.1 | 8.1 | 10.1 | 99.9 |
| Toluene Plus Ethylbenzene | 0.1 | 0.0 | 2.3 | 1.7 | 2.0 | — |
| $C_8$ Plus Aromatics Including Ethylbenzene | 1.9 | 7.9 | 7.8 | 6.4 | 8.1 | — |
| Distillation | 310–342 | 310–343 | 250–282 | 250–276 | 254–284 | 281–284 |

Initially, a number of solvents, including those widely known as Shell 360, Shell 360–66; Shell VM & P, and cyclohexane were tested as developers on thermally grown $SiO_2$, aluminum, and phosphorous-doped and boron-doped oxides with Waycoat IC, SC and KMER photoresists.

Waycoat IC, SC and KMER resists are commercially available bottled resists ready for use, including the xylene solvent. Frequently, the user may add sensitizers or other activating agents, and may also add xylene as a thinner. Development performance was found to be comparable to that obtained with xylene as the developer. In the experiments, the wafers were cleanly developed when sprayed 15 seconds in developer and then subjected to a 15 second n-butylacetate rinse, or a 20 second dip in n-butylacetate rinse.

It was further found that these solvents work well as resist thinners for Waycoat IC resist. It was noted however, that because of a density difference compared to xylene, the amounts of thinner required to dilute to a specific viscosity vary from that of xylene. The primary difference between the Shell solvents and xylene is that the Shell solvents are comprised primarily of aliphatic saturated hydrocarbons while xylene is an aromatic hydrocarbon, and is unsaturated.

For each of the above-mentioned solvents (Shell 360, Shell 360–66, Shell VM & P, and cyclohexane) a photoresist composition was made using the following percentage by weight proportions: 15% resin (commercially available cyclized polyisoprene), 2% sensitizer (2,6-bis-p-azidobenzylidene)-4-methylcyclohexanone) and 83% solvent. The photoresist composition was then processed in a conventional way, including the following steps:

1. A photoresist composition was spun on wafers at 2000 to 10,000 rpm for 10 seconds.
2. The wafer was then subjected to a bake cycle for 15 minutes at 65°C.
3. The wafer was exposed to ultraviolet radiation, using standard alignment equipment.

4. The exposed wafer was developed with the same solvent.
5. The wafer was subjected to a baking cycle for 15–30 minutes at 140°–150°C.
6. The wafer was etched with a buffered etchant to pattern the $SiO_2$ layer on the wafer.
7. The photoresist was stripped using conventional photoresist remover.

The results with respect to accuracy and resolution of the patterned $SiO_2$ layer for each of the above photoresist compositions were comparable to results obtained with xylene based photoresist systems.

The above-described results were unexpected for a number of reasons. It should be recognized that xylene is a very strong solvent for the polyisoprene resin systems and for the azide sensitizer systems used in ordinary photoresist, and that it worked quite well for this purpose, so there had been no need to investigate other solvents for photoresist compositions until delayed pollution control regulations were enacted. In general, it has become common over a long period of time to utilize aromatic solvents to dissolve polymers, simply because aromatic solvents are strong solvents therefor. Further, none of the previous uses for substances such as naptha-type solvents suggest that they could be used as solvents for photoresist compositions, and in fact in some cases the prior use suggests that the substance should not be utilized as a solvent in a photoresist composition. For example, the previously described Shell non-aromatic (or low aromatic) solvents and other related petroleum distillates have been variously utilized as burning fluids, as cleaning agents, as additives for other petroleum products, and especially as paint thinners in non-aqueous paint systems. Cyclohexane is an organic solvent which has been commonly used to carry out a variety of chemical reactions, such as to purify substances, and to cause recrystallization. In one application, some of the non-aromatic naptha-type solvents previously mentioned have been used as thinning agents or in developers for xylene-based photoresist systems. However, said solvents have, in this application, been used in small percentage amounts as non-solvating agents to reduce the harshness of xylene as a solvent and a developer. It is known that the polymers, i.e., the resin and perhaps the sensitizer, in photoresist tend to swell as a result of the strength of xylene as a solvent, as discussed in *Polymer Handbook*, previously cited, due to the closeness of the value of δ for cyclized polyisoprene and xylene. However, the percentages of said solvents used as non-solvating agents in photoresist compositions have been very small to prevent polyisoprene from being precipitated. For this reason, one ordinarily would not have thought to utilize a non-aromatic, saturated hydrocarbon as solvent or developer in photoresist systems of the type described herein and it is unexpected that such hydrocarbons could be utilized as nearly 100% of the solvent for such photoresists.

The explanation of the good performance of non-aromatic, saturated hydrocarbons as solvents and developers for photoresist systems is as follows. Xylene is a far stronger solvent for polymers such as cyclized polyisoprene than is required in photoresist systems. In contrast, the non-aromatic (or, more accurately, low aromatic) saturated hydrocarbon solvents can dissolve only a very small amount of polyisoprene, but this small amount is nevertheless sufficient to permit the use of certain, carefully selected non-aromatic, saturated hydrocarbons as solvents and developers in photoresist systems.

In view of the foregoing discussion, and the data in the Tables, it may be seen that naptha-type solvents which are 90–100% saturated hydrocarbons in the C5–C10 range having distillation ranges between approximately 250°–350°F and having aromatic content sufficiently low to meet pollution control regulations may be effectively utilized as the main constituents in solvents and developers for the aforementioned photoresist systems.

Acceptable results may be obtained for photoresist compositions composed of as much a 8% by volume of the previously described sensitizer and as much as 25% by volume of the cyclized polyisoprene resin. It is also apparent that other sensitizers, sensitive to other light wavelengths, such as 1,9-benzanthr-10-one or 1,2-benz-9,10-anthraquinone may be utilized, as described in copending application, Ser. No. 176,327, filed August 30, 1971, now abandoned by the same inventor and assigned to the same assignee.

The primary advantage of photoresist compositions using the above-mentioned solvents is that they meet standards set by pollution control regulations. However, there may be additional advantages. For example, the above-mentioned solvents cost approximately one third as much as xylene. Further, photoresist compositions utilizing non-aromatic solvents may have improved shelf life, since all of the solvents discussed are less reactive than xylene, and further, none of them are photoreactive, as is xylene. Further in the above-described experiments, the adhesion of several of the photoresist compositions to the oxide layer appeared to be improved. Further, the evaporation rate is less for the particular compositions having non-aromatic saturated hydrocarbon solvents with higher distillation ranges than xylene; this results in more uniform viscosity of the photoresist as it is utilized.

In summary, the invention provides photoresist compositions using commercially available sensitizers and resins, dissolved in non-aromatic, saturated aliphatic, or cyclo-aliphatic hydrocarbon solvents. The photoresist compositions meet with the requirements of recent air pollution regulations, and further appear to have potential performance and cost advantages over the commonly used xylene-based photoresist compositions.

What is claimed is:

1. A process for developing a cyclized polyisoprene photoresist composition coated on a substrate after imagewise exposure which comprises applying a saturated hydrocarbon naphtha or cyclohexane solvent to the unexposed portions of said photoresist coating to remove the unexposed portions while allowing the exposed portions to remain on said substrate said composition comprising a cyclized polyisoprene containing double bonds and 2,6-bis(p-azido benzylidene)-4-methylcyclohexanone as a sensitizer.

2. The process of claim 1 in which said saturated hydrocarbon naphtha or cyclohexane solvent is 90 % to 100% saturated.

3. The process of claim 1 in which said cyclized polyisoprene photoresist composition is applied to the substrate in a saturated hydrocarbon naptha or cyclohexane solvent.

* * * * *